United States Patent

Marley

[15] 3,700,915

[45] Oct. 24, 1972

[54] FULL-POWER/HALF-POWER LOGIC GATE

[72] Inventor: Robert R. Marley, San Jose, Calif.

[73] Assignee: Motorola, Inc., Franklin Park, Ill.

[22] Filed: Jan. 18, 1971

[21] Appl. No.: 107,149

[52] U.S. Cl. ..................307/215, 307/218, 307/296, 330/30 D

[51] Int. Cl. ........................H03k 19/34, H03k 19/30

[58] Field of Search..........307/31, 32, 33, 35, 36, 38, 307/39, 24, 29, 60, 215, 218, 296, 297, 235; 323/1, 81, 96, 97; 330/30 D

[56] References Cited

UNITED STATES PATENTS

| | | | |
|---|---|---|---|
| 3,259,761 | 7/1966 | Narud et al. | 307/215 |
| 3,226,574 | 12/1965 | Winkler | 307/292 X |
| 3,396,282 | 8/1968 | Sheng et al. | 307/215 X |
| 3,092,783 | 6/1963 | Krohn | 330/30 D |
| 3,430,071 | 2/1969 | Sheng | 307/215 X |
| 3,444,476 | 5/1969 | Leidich | 330/30 D |
| 3,501,647 | 3/1970 | Giacomo | 307/215 X |
| 3,518,449 | 6/1970 | Chung | 307/215 |
| 3,541,466 | 11/1970 | Yee | 330/30 D |
| 3,573,488 | 4/1971 | Beelitz | 307/215 X |
| 3,579,272 | 5/1971 | Foss | 307/218 |

*Primary Examiner*—Herman Karl Saalbach
*Assistant Examiner*—L. N. Anagnos
*Attorney*—Mueller & Aichele

[57] ABSTRACT

An integrated circuit logic gate suitable for use in LSI arrays provides OR and NOR logic outputs and includes additional collector and emitter resistors causing the array to be operated at half power levels. If a full power array is desired optional metalization shunting of the additional emitter and collector resistors is provided while maintaining the full logic swing across the same DC reference level which exists for half power operation. Thus, full power and half power gates may be interconnected without necessitating the use of additional interface circuits.

5 Claims, 1 Drawing Figure

PATENTED OCT 24 1972
3,700,915
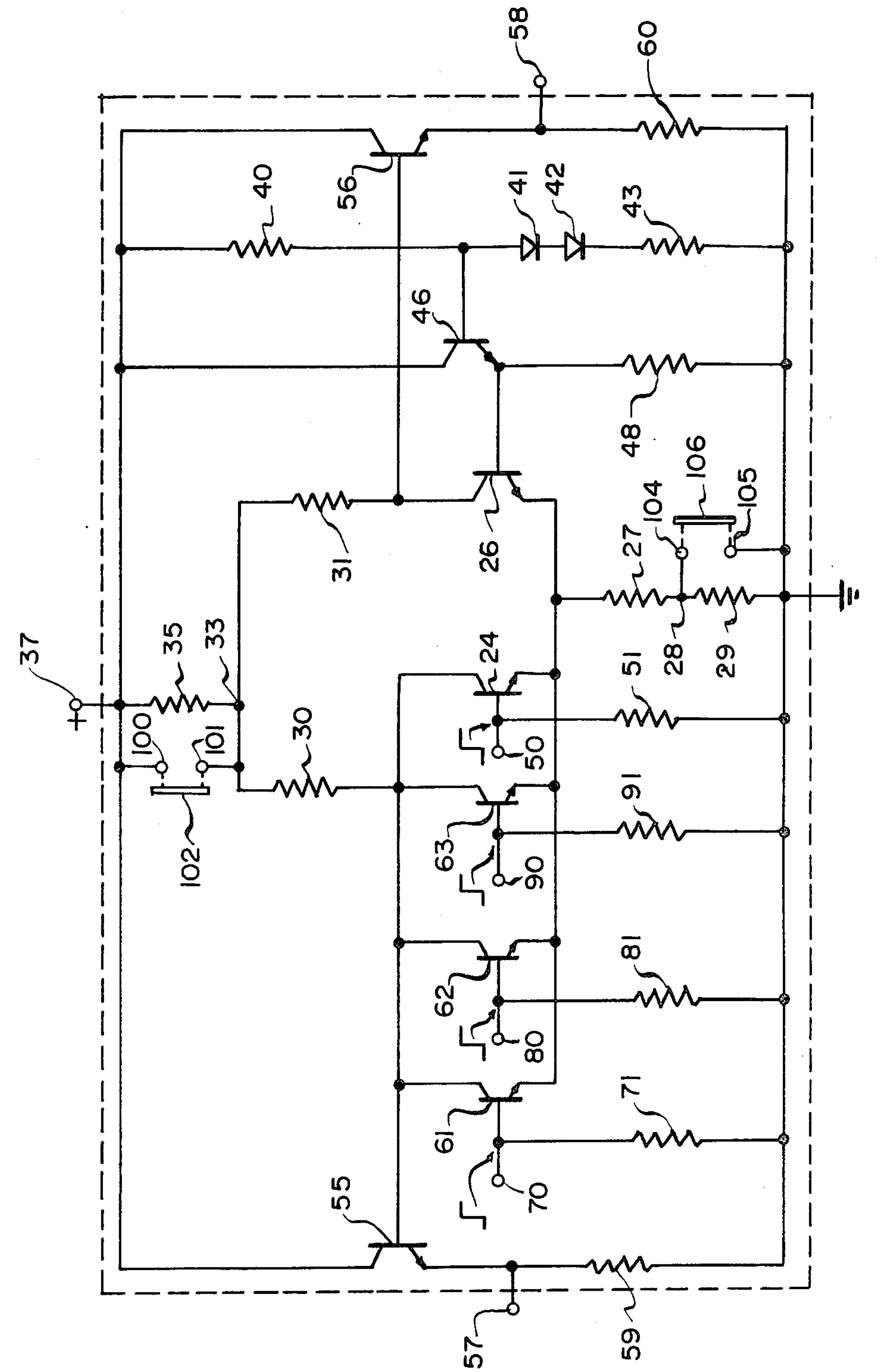
INVENTOR
ROBERT R. MARLEY
BY Mueller & Aichele
ATTORNEYS

FULL-POWER/HALF-POWER LOGIC GATE

BACKGROUND OF THE INVENTION

The circuit delay of current mode integrated circuit logic gates such as shown in Narud and Seelbach U.S. Pat. No. 3,259,761, issued July 5, 1966, is normally collector response limited. This means that as collector resistors increase in value with fixed active devices, the circuit becomes increasingly slower in operation. In medium or large scale integration (MSI or LSI), it usually is necessary to minimize the delay while maintaining minimum power per gate as well.

Also when large numbers of gates are fabricated on a single die, the noise margin required is less than that required by externally wired gates. Because of the higher noise environment present on the gates which are used with external interconnections, than is required for the signal swing of gates which are internal to the MSI or LSI array. As a consequence, the optimum MSI or LSI logic array may operate at lower power with a lower logic swing for internal gates, with full power and full logic swing being necessary only when external interconnections are made. To accomplish this in the past, an additional emitter resistor has been provided to reduce the power and logic swing for the gate configuration when it is used as an internal part of a larger array. The problem with utilizing an additional emitter resistor to reduce the signal swing, however, is that a voltage offset is introduced; so that interface circuitry is necessary for coupling full power gates to and from half power gates. In addition, when increasing the emitter current source resistance is utilized to provide the half logic swing for internal gates, there is a skewing in the noise immunity of the circuit which causes unbalanced noise immunity for the signal swing. If such a half power gate then is used to provide input signals for a full power gate providing full logic swings, the noise immunity for one side of the logic swing is at or near zero, which is a very undesirable condition.

SUMMARY OF THE INVENTION

Accordingly, it is an object of this invention to provide an improved integrated circuit logic gate.

It is an additional object of this invention to provide an integrated circuit logic gate capable of use as a half power or full power gate depending upon metalization options.

It is a further object of this invention to provide a universal integrated circuit logic gate capable of either full power or half power operation with the logic swings in either mode being about the same reference point and with substantially the same propagation delay in either mode of operation.

In accordance with the preferred embodiment of this invention, an integrated circuit logic gate for use operation as a half power or full power gate includes first and second transistors differentially connected with the emitter electrodes coupled together at a first junction. First and second resistors are coupled with the collectors of the first and second transistors, respectively, and are coupled together at a second junction point. A third resistor is connected between the second junction point and a first DC supply terminal, with fourth and fifth resistors being coupled together at a third junction point and in a series between a second DC supply terminal and the first junction point. The base of the first transistor is provided with a reference potential, and input gating signals are supplied to the base electrode of the second transistor, with the relative magnitudes of the reference potential and the input signal causing the gate to operate in one state with the first transistor conductive and the second transistor nonconductive, or to operate in a second state with the conductivities of the transistors being reversed. By connecting conductive shunts across the third and fourth resistors, the logic gate is caused to operate as a full power gate; and in the absence of such shunts, the gate operates as a half power gate. In either the full power or half power modes, the logic swing is about the same reference level; so that half power gates may be used to drive full power gates directly, and vice-versa.

BRIEF DESCRIPTION OF THE DRAWING

The sole FIGURE of the drawing is a detailed schematic diagram of a preferred embodiment of the invention.

DETAILED DESCRIPTION

The logic gate shown in the drawing is an integrated circuit gate, indicated by the dotted lines enclosing the circuit, and may be constructed as an individual die or chip or as part of a larger array.

The current switching circuit is in the form of a differential switch including a pair of NPN switching transistors 24 and 26 and the emitters of the transistors 24 and 26 are connected to a point of reference potential, indicated as ground in the drawing, through a pair of emitter resistors 27 and 29, with the resistors 27 and 29 being connected together at a junction point 28.

The collector of the transistor 24 is connected through a resistor 30 to a junction point 33, and the collector of the transistor 26 is connected to the junction point 33 through a collector resistor 31. Completing the connection between the junction point 33 and a bonding pad 37, to which is supplied a positive DC operating potential, is a coupling resistor 35.

In order to establish an operating point for the current switching transistors 24 and 26, a voltage divider comprising a first resistor 40, a pair of diodes 41 and 42, and a second resistor 43, is connected between the bonding pad 37 and ground. The junction between the diode 41 and the resistor 40 is connected to the base of an NPN reference transistor 46, and collector of which is connected directly to the bonding pad 37, and the emitter of which is connected to the base of the transistor 26 and through a resistor 48 to ground. The diodes 41 and 42 provide temperature compensation for the diode drops across the base-emitter junctions of the transistors 46 and 26, so that a relatively stable voltage supply is applied to the base of the transistor 26 and operates as a reference bias potential for the current switching circuit. By adjusting the relative values of the resistors 40 and 43, this reference potential can be set to establish the desired operating level for the current switching circuit.

Input signals are applied to the base of the transistor 24 at an input terminal or bonding pad 50 across an optional pull-down resistor 51, which is connected between the base of the transistor 24 and ground. The input signals are in the form of voltage transitions between two voltage levels as indicated in the drawing. The base of the transistor 26 is biased by the potential present on the emitter of the transistor 46 to a level which is chosen to be approximately half way between the upper and lower voltage levels of the input signal. As a consequence, when the potential on the input terminal 50 is lower than the potential applied to the base of the transistor 26 by an amount exceeding the transition width of the differential switch, the transistor 26 is rendered fully conductive. This causes the current drawn from the source at the bonding pad 37 to be drawn through the transistor 26, producing a potential at the emitter of the transistor 24 which reduces the base-emitter drop of the transistor 24 to the point where only leakage currents flow in the collector of this transistor.

So long as the input signal applied to the terminal 50 is in a voltage condition which is lower than the potential applied to the base of the transistor 26, the transistor 24 is nonconductive, with the collector potential on the collector of the transistor 24 approaching the potential present at the junction 33. On the other hand, when the input signal is at a voltage level which is more positive than the potential applied to the base of the transistor 26 by an amount exceeding the transition width of the differential switch, the transistor 24 is rendered conductive and the conduction of the transistor 26 is reduced to a leakage level. Thus, the potential on the collector of the transistor 24 drops to a value near the potential present across the resistors 27 and 29, while the potential present on the collector of the transistor 26 rises to the value of the potential present at the junction 33.

Since the logic current switching circuit including the transistors 24 and 26 is essentially a constant current circuit, the current flowing from the bonding pad 37 to ground is essentially constant, irrespective of which of the transistors 24 or 26 is conductive. Thus, the potential at the junction 33 is essentially constant, so that the junction point 33 is at AC ground. As a consequence, the resistor 35 does not affect the switching time or operation delay of the transistors 24 and 26.

With the resistors 35 and 29 connected in the circuit as described above, the gate is operated a a half power gate or a reduced power gate depending on the relative values of the various resistors. The complementary outputs of the gate are present at the collectors of the transistors 24 and 26 and are applied respectively to the bases of a pair of NPN emitter-follower transistors 55 and 56, the collectors of which are connected to the bonding pad 37 and the emitters of which are connected to ground through resistors 59 and 60 respectively. Output signals are obtained from the emitter of the transistor 55 on an output terminal or bonding pad 57 and output signals are obtained from the emitter of the transistor 56 on an output terminal or bonding pad 58.

To cause the current switching circuit including the transistors 24 and 26 to be operated as an OR gate or a NOR gate, additional input transistors 61, 62, and 63 are provided, and the collectors of the additional input transistors are connected to the collector of the transistor 24 and the emitters of these additional input transistors are connected to the emitter of the transistor 24. Thus, the transistors 24 and 61 to 63 all are operated in parallel. Additional input terminals 70, 80, and 90 are connected to the bases of the transistors 61, 62, and 63 and additional pull down resistors 71, 81, and 91 are connected between the bases of the transistors 61, 62, and 63, respectively, and ground. The input signals applied to the input terminals 70, 80, and 90 are of the same type as the input signals applied to the terminal 50, with the operation of the gate being such that the output of the emitter-follower transistor 56 functions as an OR gate output in response to the various input signals and the output obtained from the emitter of the transistor 55 on output terminal 57 constitutes a NOR gate output.

The pull down resistors 51, 71, 81, and 91 are provided in order to load driving gates coupled to the input terminals 50, 70, 80, and 90 for fan out on a die containing additional gates, or for gates, the output of which leave the integrated circuit die and drive short, low-capacity lines. If these features are not desired, the pull down resistors 51, 71, 81, and 91 can be eliminated.

To adapt the gate for full power operation, a metalization option on the die is provided in the form of a pair of conductive shunting terminals 100 and 101 connected across the resistor 35 and a pair of conductive shunting terminals 104 and 105 connected across the emitter resistor 29. A metalization strap in the form of a strip 102 then is provided physically connected across the terminals 100 and 101, as indicated in the dotted lines in the drawing. Similarly, a metalization strap 106 is provided physically connected across the terminals 104 and 105, as indicated in the dotted lines.

When the straps 102 and 106 bridge the terminals 100, 101 and 104, 105, the resistors 35 and 29 are short-circuited; so that a greater voltage is available across the terminals 33 and 28 in the circuit than is present when the resistors 35 and 29 are connected in the series circuit between the bonding pad 37 and ground. As a consequence, the logic swing of the circuit in response to input signals applied to any of the input terminals is substantially greater than when the resistors 35 and 29 are connected in the circuit; so that the gate is operated as a full power gate. As stated previously, the propagation time or switching time of the circuit is not affected by the effective insertion and removal of the resistor 35 from the circuit since the junction 33 effectively is an AC ground. Thus, even though the collector resistance of the switching transistors 24 and 26 is increased and decreased in accordance with the presence or absence of the metalization strip 102, this difference in resistance has no affect on the propagation or AC switching time of the circuit.

With the resistance used to effect the reduction in power or logic signal swing in changing the gate from full power to half power or reduced power operation being divided between the collector and emitter circuits of the switching gate, as shown in the drawing, intermixing of gates of half power and full power configurations may be accomplished without additional interface circuits. A full power gate may directly drive inputs to a half power gate, and vice-versa. Some inputs of a gate in a large array may be supplied with half power gate outputs and other inputs of the same may be provided with full power gate outputs since all of the logic signal swings are about the same reference point, established by a common reference source obtained from the emitter of the reference transistor 46. This reference transistor can be used to supply the reference potential to a large number of full power and half power gates formed as part of a single MSI or LSI array.

It should be noted that the number of inputs to a gate may be greater or less than the four inputs used in the foregoing description. This number was selected merely for purposes of illustration and is not to be considered as limiting. In addition the resistors 29 and 35 could be in the form of transistor diodes or the like if a non-linear characteristic is desired. Also, the metalization strap 106 could be replaced by optionally connecting the terminal 28 directly to the substrate (ground) of the chip.

I claim:

1. An integrated circuit logic gate for optional operation as full power or reduced power gate including in combination:

first and at least one second transistors, each of the same conductivity type and each having emitter, collector, and base electrodes, with the emitter electrodes of the first and second transistors being coupled together at a first junction point;

first and second resistance means coupled with the collectors of the first and second transistors, respectively, and coupled together at a second junction point;

first and second supply terminals adapted to receive a DC potential therebetween;

third resistance means coupled between the second junction point and the first supply terminal;

fourth and fifth resistance means coupled together at a third junction point and in series circuit between the second supply terminal and the first junction point;

reference circuit means coupled with the base electrode of the first transistor for supplying a reference potential thereto;

signal input means coupled with the base electrode of the second transistor for applying input signals thereto; the gate operating in a first state with one of the first and second transistors conductive for one predetermined relationship of the input signal and the reference potential and operating in a second state with the other of the first and second transistors conductive for a second predetermined relationship of the input signal and the reference potential;

first and second conductive means connected to opposite ends of the third resistance means and adapted for physical interconnection;

third and fourth conductive means connected to opposite ends of the fourth resistance means and adapted for physical interconnection, the logic gate operating as a reduced power gate in the absence of interconnection of the first and second and third and fourth conductive means and operating as a full power gate with concurrent physical interconnection of the first conductive means to the second conductive means and the third conductive means to the fourth conductive means.

2. The combination according to claim 1 further including first and second emitter-follower circuit means coupled with the collector electrodes of the first and second transistors, respectively, for providing first and second outputs of opposite phase.

3. The combination according to claim 1 further including a plurality of second transistors, each of the second transistors having emitter, base, and collector electrodes, with each collector electrode coupled with the second resistance means and each emitter electrode coupled with the first junction point; and a plurality of signal input means each coupled with the base electrode of a different one of the second transistors for applying input signals thereto.

4. The combination according to claim 3 further including third and fourth transistors, each having emitter, base, and collector electrodes, with the base electrodes thereof coupled with the collector electrodes of the first and second transistors, respectively, the collector electrodes thereof coupled with the first supply terminal, and the emitter electrodes thereof coupled in circuit with the second supply terminal.

5. The combination according to claim 4 wherein all of the transistors are of the same conductivity type.

* * * * *